US010856428B2

(12) United States Patent
Imaizumi et al.

(10) Patent No.: US 10,856,428 B2
(45) Date of Patent: Dec. 1, 2020

(54) RATTLING PREVENTION STRUCTURE, ELECTRONIC COMPONENT MODULE, ELECTRICAL CONNECTION BOX, AND WIRE HARNESS

(71) Applicant: YAZAKI CORPORATION, Tokyo (JP)

(72) Inventors: Yoshihito Imaizumi, Makinohara (JP); Jun Sato, Makinohara (JP)

(73) Assignee: YAZAKI CORPORATION, Tokyo (JP)

( * ) Notice: Subject to any disclaimer, the term of this patent is extended or adjusted under 35 U.S.C. 154(b) by 0 days.

(21) Appl. No.: 16/568,239

(22) Filed: Sep. 11, 2019

(65) Prior Publication Data

US 2020/0120816 A1    Apr. 16, 2020

(30) Foreign Application Priority Data

Oct. 16, 2018   (JP) .................................. 2018-194890

(51) Int. Cl.
*H05K 1/14* (2006.01)
*H05K 5/00* (2006.01)
*B60R 16/023* (2006.01)
*B60R 16/02* (2006.01)

(52) U.S. Cl.
CPC ....... *H05K 5/0069* (2013.01); *B60R 16/0238* (2013.01); *H05K 5/0039* (2013.01); *H05K 5/0073* (2013.01); *B60R 16/0207* (2013.01)

(58) Field of Classification Search
USPC .................. 361/728, 736, 752, 796, 800
See application file for complete search history.

(56) References Cited

U.S. PATENT DOCUMENTS

| 6,210,208 B1 * | 4/2001 | Barnes ................. H01R 4/4818 |
| | | 219/536 |
| 2002/0101041 A1 * | 8/2002 | Kameyama .......... H01R 13/521 |
| | | 277/628 |
| 2017/0140863 A1 * | 5/2017 | Aichi .................... H01F 27/022 |
| 2017/0164496 A1 | 6/2017 | Imaizumi |
| 2020/0119532 A1 * | 4/2020 | Imaizumi ................. H02G 3/14 |

FOREIGN PATENT DOCUMENTS

JP           2017-103916 A      6/2017

* cited by examiner

*Primary Examiner* — Hung S. Bui
(74) *Attorney, Agent, or Firm* — Kenealy Vaidya LLP

(57) ABSTRACT

A ratting prevention structure is provided. Further, an electronic component module, an electrical connection box, and a wire harness which adopt the ratting prevention structure are provided. The electronic component module includes a cover having a rectangular opening portion, a connector block inserted into the opening portion of the cover, and an engagement mechanism engaging the block member with the opening portion of the cover. The rattling prevention structure is used to prevent rattling between the cover and the block member. In the rattling prevention structure, four pressing protrusions are formed at any one of four corner parts of the cover and four corner portions of the block member at the opening portion. The four pressing protrusions are configured to bend four walls of the cover inward while displacing the four corner parts of the cover outward.

10 Claims, 11 Drawing Sheets

RATTLING PREVENTION STRUCTURE, ELECTRONIC COMPONENT MODULE, ELECTRICAL CONNECTION BOX, AND WIRE HARNESS

CROSS-REFERENCE TO RELATED APPLICATIONS

This application is based on and claims priority under 35 USC 119 from Japanese Patent Application No. 2018-194890 filed on Oct. 16, 2018, the contents of which are incorporated herein by reference.

TECHNICAL FIELD

The present invention relates to a rattling prevention structure including a bottomed cylindrical cover which includes a substantially rectangular opening portion, a block member which is inserted into the opening portion of the bottomed cylindrical cover, and an engagement mechanism which is configured to engage the block member with the opening portion. The present invention also relates to an electronic component module in which the rattling prevention structure is adopted, an electrical connection box including the electronic component module, and a wire harness including the electronic component module.

BACKGROUND ART

Techniques for an electronic component module and an electrical connection box are disclosed, for example, in Patent Document 1 below. The electronic component module includes a cover, a substrate which is housed inside the cover from an outside, and a connector block (block member) which is engaged with a rectangular opening portion of the cover. The electrical connection box includes the electronic component module and a frame which is configured to house and lock the electronic component module in the frame. Also, the electrical connection box is mounted on a vehicle. Examples of the electronic component module include a relay module and the like.

The cover and the connector block are engaged by an engagement mechanism formed across the cover and the connector block. The engagement mechanism is disposed and formed in accordance with a long side part of the opening portion of the cover. The connector block is formed with a projection (a portion denoted by a reference numeral 55 in Patent Document 1 below) for stabilizing a state in which the cover and the connector block are engaged by the engagement mechanism. The projection is disposed and formed on a short side part of the connector block so as to restrict the long side part of the cover from moving away from an outer surface of the connector block (the long side part of the cover is bent in a direction in which the long side part of the cover is in close contact with the outer surface of the connector block by operation of the projection).

CITATION LIST

Patent Literature

Patent Literature 1: JP-A-2017-103916

SUMMARY OF INVENTION

In a related art described above, when rattling occurs due to vibration, the protrusion may be worn out. If abrasion occurs, the state of engagement by the engagement mechanism becomes unstable, and in some cases, there is a problem that the connector block or a substrate may be detached from a case.

The present invention has been made in view of the above circumstances, and an aspect of the present invention is to provide a rattling prevention structure capable of preventing rattling. Another object of the present invention is to provide an electronic component module, an electrical connection box, and a wire harness, which use the rattling prevention structure.

A rattling prevention structure according to a first aspect of the present invention for solving the above problems including: a bottomed cylindrical cover which includes a substantially rectangular opening portion; a block member which is inserted into the opening portion of the bottomed cylindrical cover; and an engagement mechanism which is configured to engage the block member with the opening portion, in which four pressing protrusions are formed at any one of four corner parts of the cover and four corner portions of the block member at the opening portion so as to bend four walls of the cover inward while displacing the four corner parts outward.

According to the present invention having the feature of the first aspect, when the block member is inserted into the opening portion of the cover, the four walls of the cover are bent inward by operation of the four pressing protrusions, so that bent parts press the block member. Therefore, even when vibration occurs, rattling does not occur in an X direction and a Y direction (a longitudinal direction and a lateral direction). Further, when the bent parts press the block member, the cover and the block member are not likely to be disengaged from each other. Therefore, according to the present invention, rattling can be prevented even when vibration occurs, and thus an engagement state by the engagement mechanism can be maintained stable. If the engagement state can be maintained stable, reliability can also be enhanced.

According to a second aspect of the present invention, in the rattling prevention structure according to the first aspect, the four corner parts and the four corner portions are formed in tapered shapes facing each other.

According to the present invention having the feature of the second aspect, a tapered shape can be provided as a better shape. According to the present invention, for example, the rigidity of the cover can be increased by forming the four corner parts of the cover in tapered shapes. Therefore, cost can be reduced by changing a material of the cover to a low-cost material by the increased rigidity.

An electronic component module according to a third aspect of the present invention for solving the above problems including: a substrate on which a plurality of electronic components are mounted, a bottomed cylindrical cover which includes a substantially rectangular opening portion, a block member which is inserted into the opening portion of the cover in a state that the substrate is held, and an engagement mechanism which is configured to engage the block member with the opening portion, in which the rattling prevention structure according to the first or the second aspect is used to prevent rattling between the cover and the block member.

According to the present invention having the feature of the third aspect, rattling does not occur between the cover and the block member, so that a better electronic component module can be provided.

An electrical connection box according to a fourth aspect of the present invention for solving the above problems including the electronic component module according to the third aspect, a frame to which the electronic component module is assembled, and a lid member which is configured to cover a frame opening portion of the frame.

According to the present invention having the feature of the fourth aspect, the electronic component module having the effects described above is provided, so that a better electrical connection box can be provided.

A wire harness according to a fifth aspect of the present invention for solving the above problems includes the electrical connection box according to the fourth aspect at an end and is wired in a vehicle.

According to the present invention having the feature of the fifth aspect, the electronic component module and the electrical connection box having the effects described above are provided so that a better wire harness can be provided.

A wire harness according to a sixth aspect of the present invention for solving the above problems includes the electronic component module according to the third aspect at an end and is wired in a vehicle.

According to the present invention having the feature of the sixth aspect, the electronic component module having the effects described above is provided, so that a better wire harness can be provided.

According to a seventh aspect of the present invention, in the wire harness according to the sixth aspect, the cover of the electronic component module is formed with a bracket attachment and detachment portion which is attachable to and detachable from a bracket provided in the automobile.

According to the present invention having the feature of the seventh aspect, attachment of the electronic component module to an automobile can be facilitated.

According to the rattling prevention structure of the present invention, it is possible to prevent rattling between the cover and the block member at the opening portion of the cover.

Accordingly, it is possible to maintain the state of the engagement by the engagement mechanism in a stable state and to enhance reliability. Further, according to the present invention, it is possible to provide better electronic component module, electrical connection box, and wire harness by using the rattling prevention structure having the above effects.

BRIEF DESCRIPTION OF DRAWINGS

FIG. 4A is an enlarged perspective view of an opening portion side in FIG. 3, and FIG. 4B is viewed from an arrow C direction in FIG. 4A.

FIG. 5A is an enlarged perspective view of FIG. 3, and FIG. 5B is viewed from an arrow D direction in FIG. 5A.

DESCRIPTION OF EMBODIMENTS

An electronic component module includes a substrate on which a plurality of electronic components are mounted, a bottomed cylindrical cover which includes a substantially rectangular opening portion, a block member which is inserted into the opening portion of the cover in a state that the substrate is held, and an engagement mechanism which is configured to engage the block member with the opening portion. The rattling prevention structure is used to prevent rattling between the cover and the block member. In the rattling prevention structure, four pressing protrusions are formed at any one of four corner parts of the cover and four corner portions of the block member at the opening portion. The four pressing protrusions are configured to bend four walls of the cover inward while displacing the four corner parts of the cover outward.

Embodiment

Figure 1:
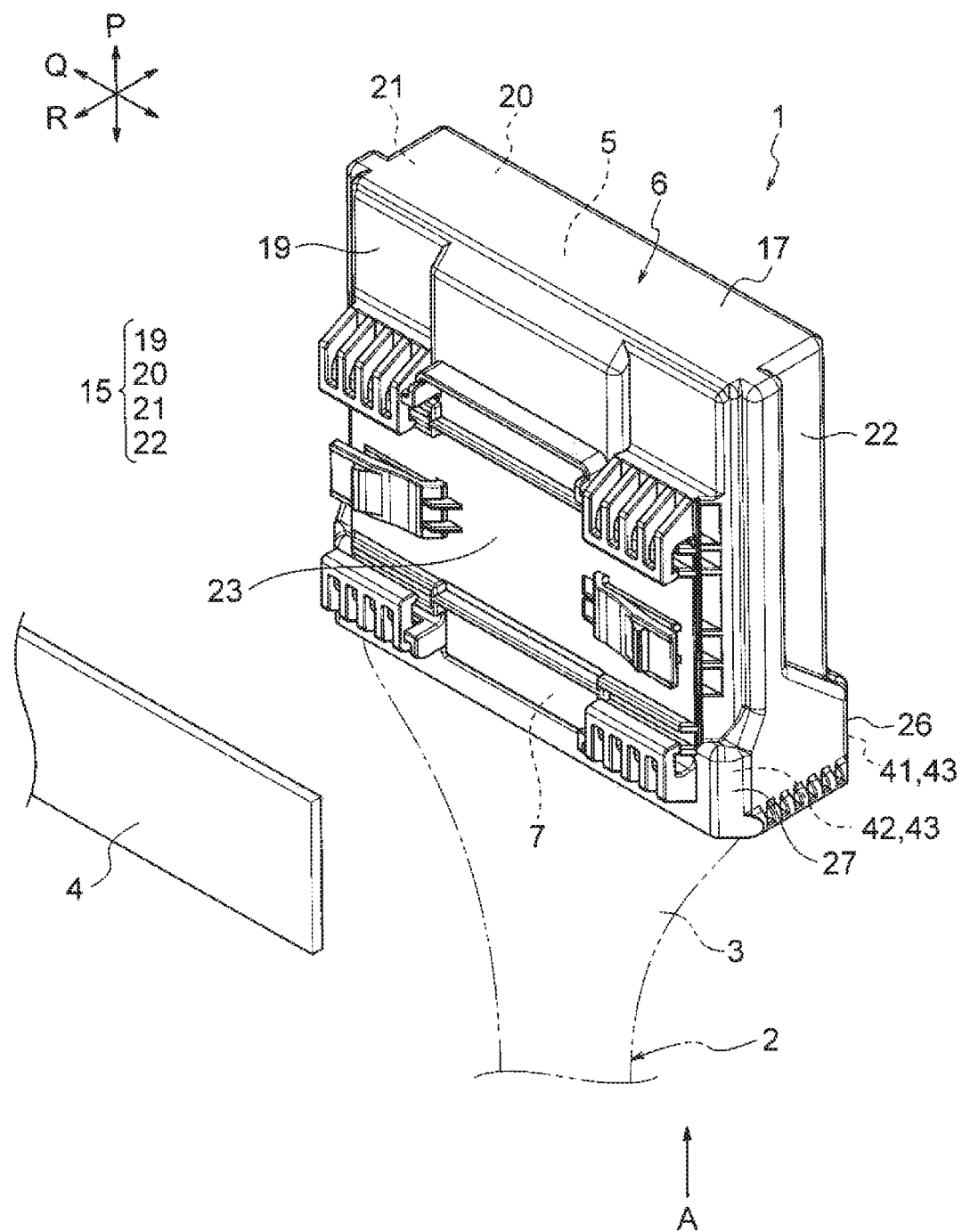
FIG. 1 is a perspective view illustrating an electronic component module according to an embodiment of the present invention.
Figure 2:
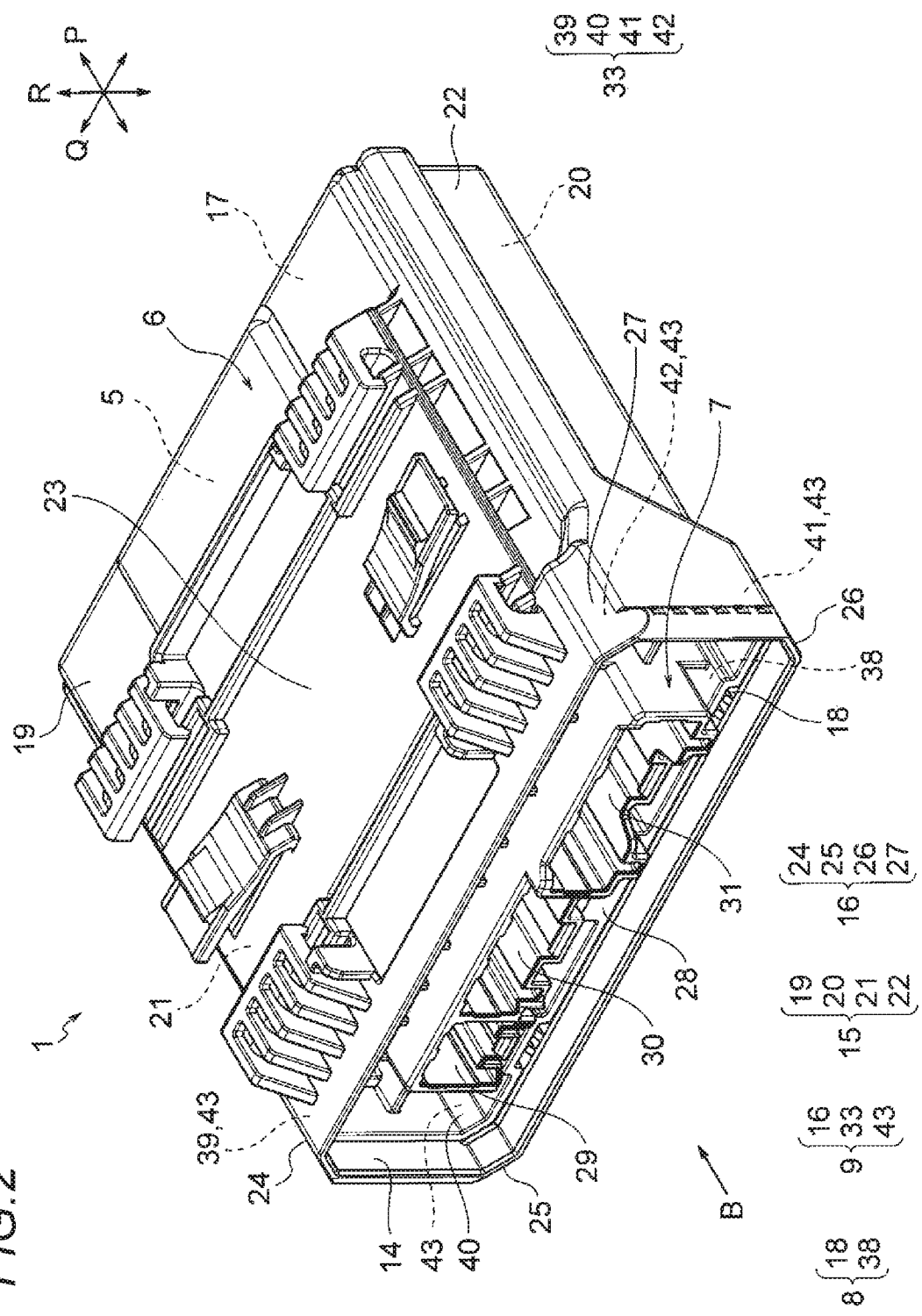
FIG. 2 is a perspective view of the electronic component module in FIG. 1 as viewed from an arrow A direction.
Figure 3:
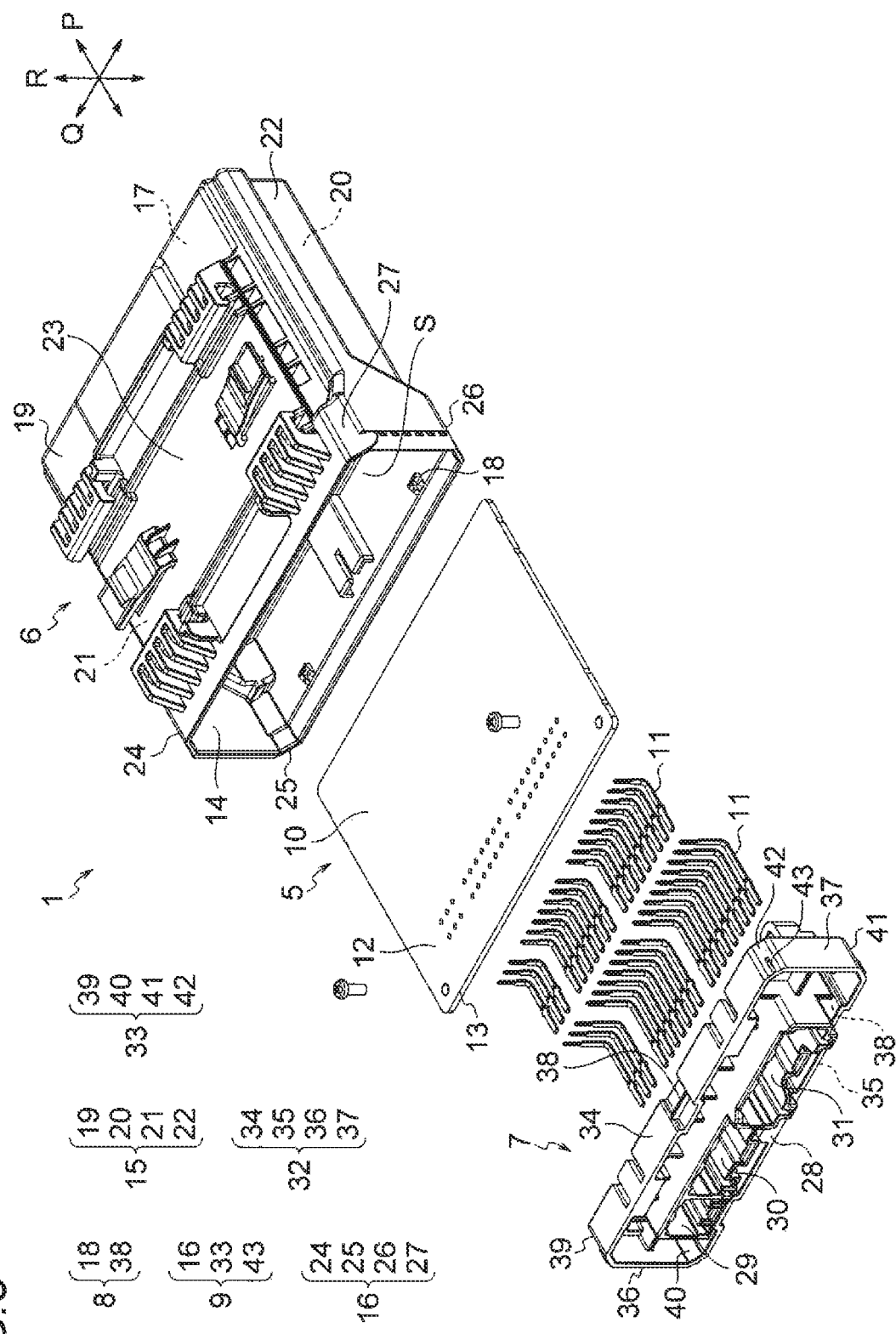
FIG. 3 is an exploded perspective view illustrating a configuration of the electronic component module.
Figure 4A:
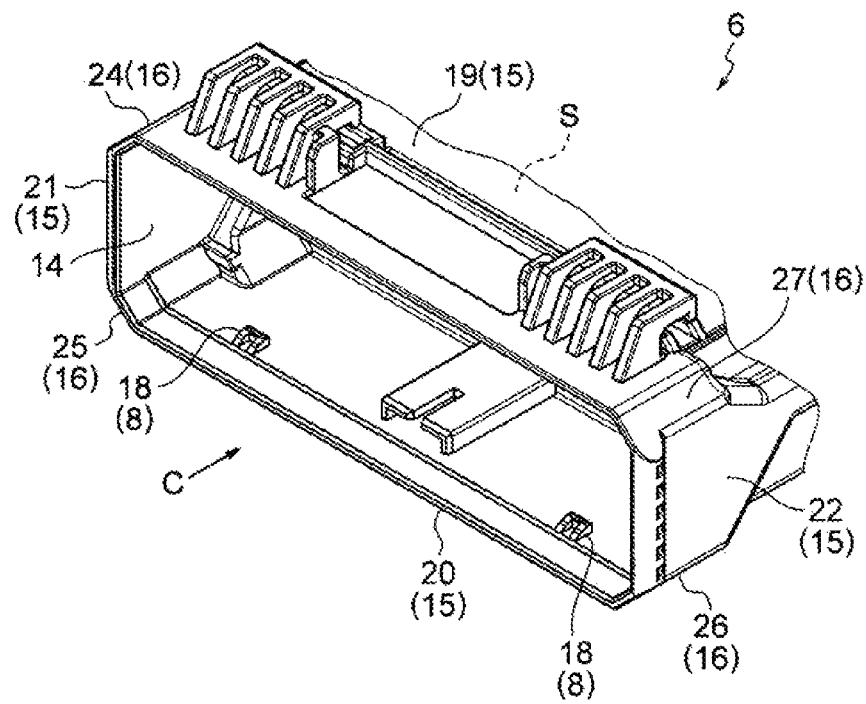
FIGS. 4A and 4B illustrate a cover.
Figure 4B:
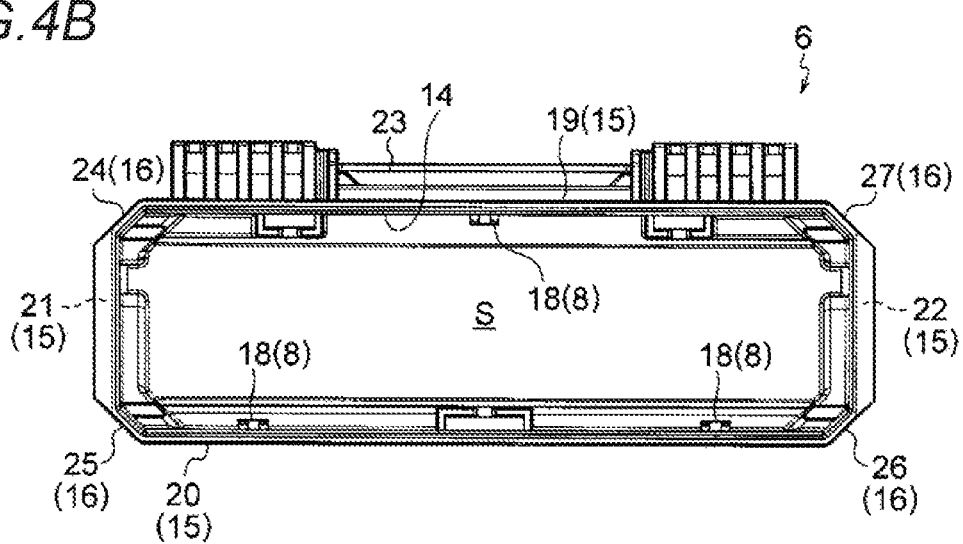
Figure 9:
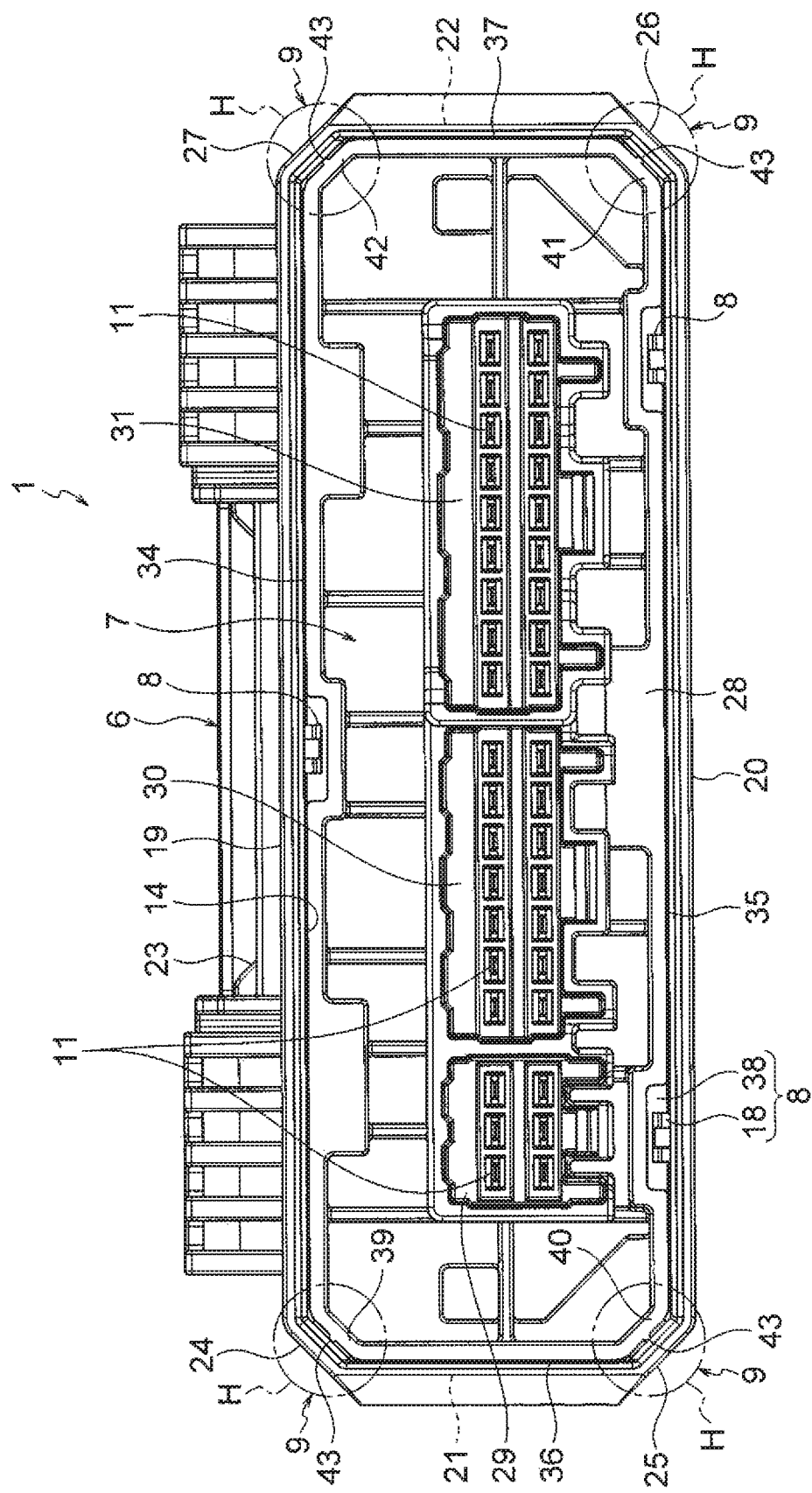
FIG. 9 is a view of the electronic component module in FIG. 2 as viewed from an arrow B direction.
Figure 10A:
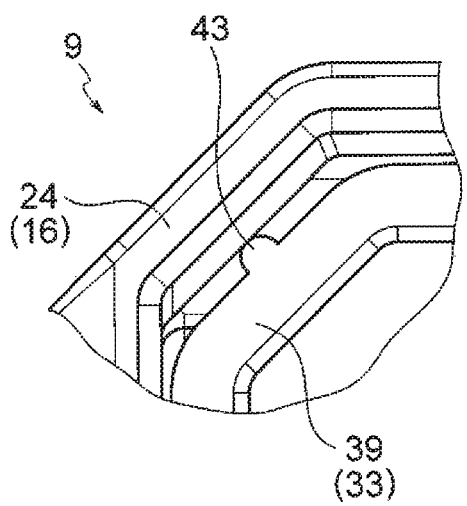
FIGS. 10A to 10D are enlarged views of four main parts of the electronic component module which are indicated by circles H in FIG. 9.
Figure 10B:
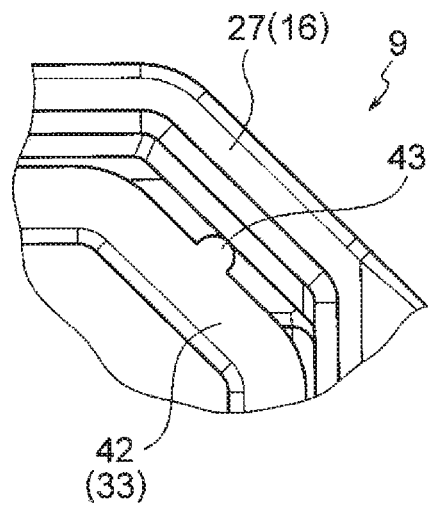
Figure 10C:
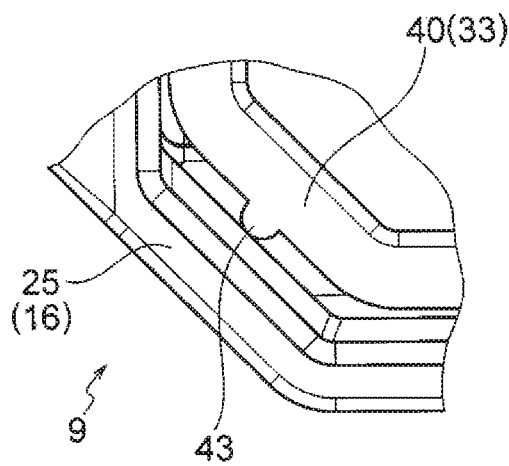
Figure 10D:
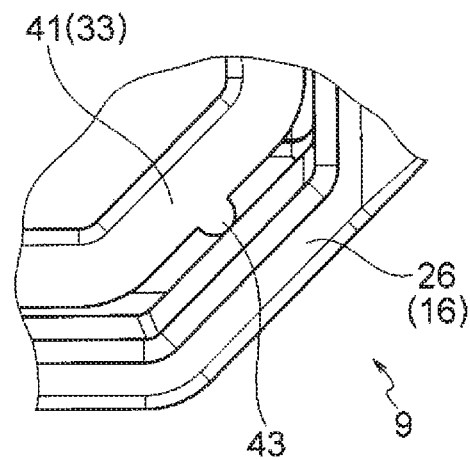
Figure 11:
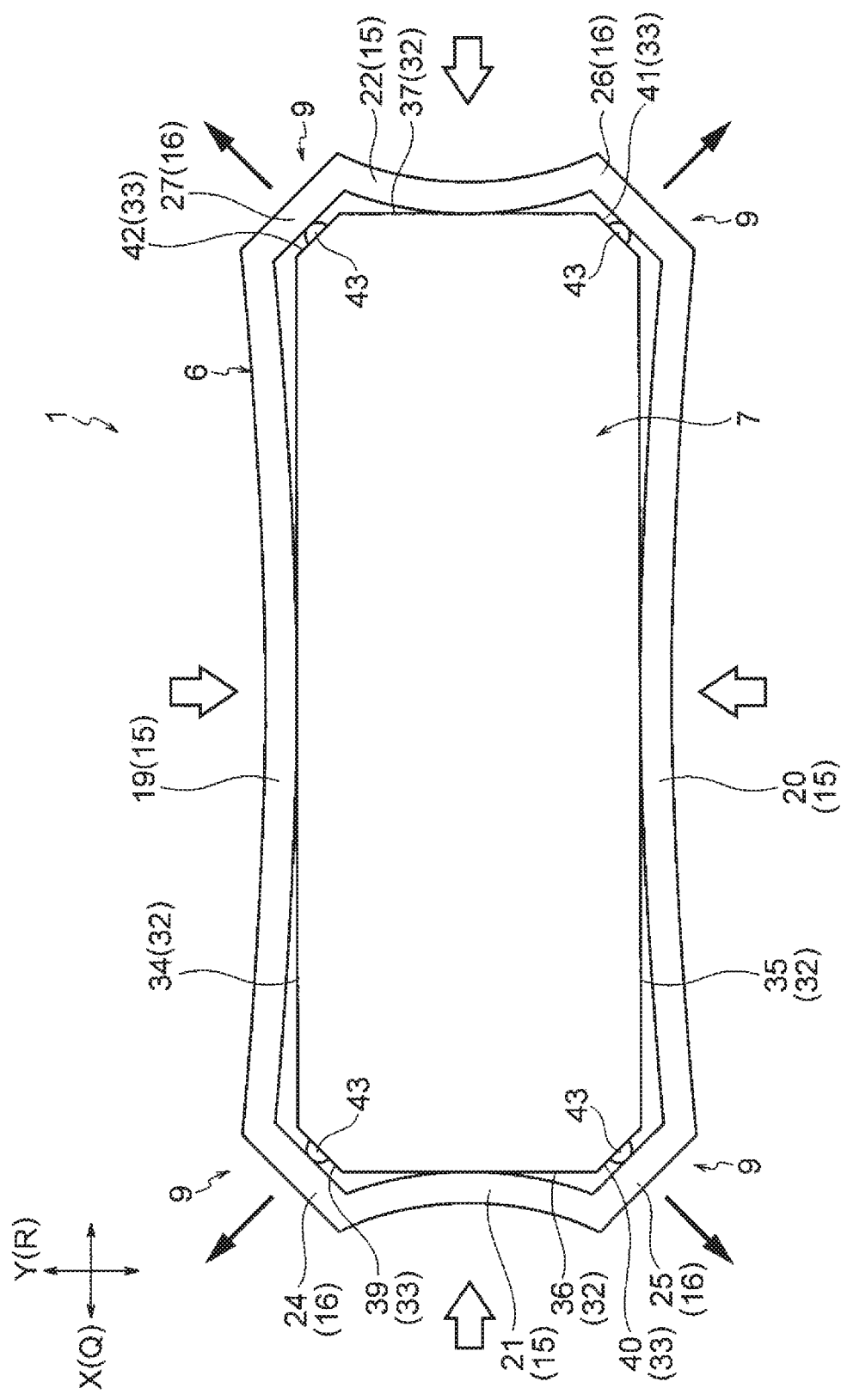
FIG. 11 schematically illustrates operation of four pressing protrusions in FIGS. 9 and 10.

An embodiment will be described below with reference to the drawings. FIG. 1 is a perspective view illustrating an electronic component module according to an embodiment of the present invention. FIG. 2 is a perspective view of the electronic component module in FIG. 1 as viewed from an arrow A direction. FIG. 3 is an exploded perspective view illustrating a configuration of the electronic component module. FIGS. 4A and 4B illustrate a cover. FIGS. 5A to 7 illustrate a connector block. FIGS. 8A to 8D are enlarged views of main parts of the connector block in FIGS. 6 and 7. FIG. 9 is a view of the electronic component module in FIG. 2 as viewed from an arrow B direction. FIGS. 10A to 10D are enlarged views of main parts of the electronic component module in FIG. 9. FIG. 11 schematically illustrates operation of four pressing protrusions in FIGS. 9 and 10.

In FIGS. 1 to 3, an arrow P indicates an upper-lower direction, an arrow Q indicates a left-right direction (X direction in FIG. 11), and an arrow R indicates a front-rear direction (Y direction in FIG. 11) (orientation is an example).

<Electronic Component Module 1>

In FIG. 1, the electronic component module 1 is disposed at a predetermined end 3 of a wire harness 2 wired in an automobile. In other words, the electronic component module 1 is connector-connected to a plurality of connectors (not illustrated) provided on the end 3 and is mounted at a predetermined position of the automobile in this connection state. An example of a mounting destination of the electronic component module 1 is a bracket 4 provided in an automobile. The electronic component module 1 is formed so as to be detachably attached to the bracket 4.

The electronic component module 1 may be mounted as follows. That is, an electrical connection box includes electronic component module 1, a frame to which the electronic component module 1 is assembled, and a lid member which is configured to cover a frame opening portion of the frame. The electrical connection box may be mounted on an end of a wire harness so as to be mounted on an automobile.

<Configuration of Electronic Component Module 1>

In FIGS. 1 to 3, the electronic component module 1 includes a substrate 5, a cover 6, and a connector block 7 (block member). The electronic component module 1 includes an engagement mechanism 8 which is configured to engage the cover 6 and the connector block 7, and a rattling prevention structure 9 which is configured to prevent rattling between the cover 6 and the connector block 7. The electronic component module 1 according to the present embodiment is connector-connected to a plurality of connectors (not illustrated), so that a "block member" described in claims is referred to as the "connector block 7".

<Substrate 5>

In FIG. 3, the substrate 5 includes a substrate body 10 which is a plate-shaped member having a rectangular shape in a plan view. A desired circuit (not illustrated) is formed on a back surface which is a lower surface of the substrate body 10. A large number of small through holes (not illustrated) are formed in the substrate body 10. A plurality of electronic components (for example, relays and resistors) are mounted on a surface side of the substrate body 10 by using the through holes. An electronic component is connected to the circuit by soldering on a back surface side. A plurality of pin terminals 11 are also provided on the front surface side of the substrate body 10. The pin terminals 11 are inserted into the through holes and connected to the circuit by soldering. The pin terminal 11 is formed in an L shape such that a proximal end side of the pin terminal 11 is disposed on a substrate front portion 12 of the substrate body 10 and the distal end side of the pin terminal 11 protrudes outward beyond an end portion 13 of the substrate front portion 12. The distal end side of the pin terminal 11 passes through the connector block 7 and is disposed such that connector connection can be performed at the connector block 7.

<Cover 6>

In FIGS. 1 to 4, the cover 6 is a resin molded product, and is formed in a bottomed cylindrical shape (box shape) including an opening portion 14 and an internal housing space S. Specifically, the cover 6 is formed in the bottomed cylindrical shape (box shape) including an opening portion 14 which opens in a substantially rectangular shape, four walls 15 which are configured to form the opening portion 14, four corner parts 16 which are one of features of the present invention, and a wall 17 at a position (position of a ceiling in orientation of the present embodiment) corresponding to a bottom of the cover 6. The cover 6 is formed in the bottomed cylindrical shape (box shape) which can house and protect the substrate 5. The cover 6 is formed in the bottomed cylindrical shape (box shape) so as to engage the connector block 7 with the opening portion 14 and to cover the connector block 7.

<Opening Portion 14>

In FIGS. 3 and 4, the opening portion 14 is formed to open in the substantially rectangular shape by the four walls 15 and the four corner parts 16 which will be described later. The opening portion 14 is formed to open in accordance with a shape of the connector block 7. A plurality of cover side lock portions 18, which are engagement mechanisms 8 on a cover 6 side, and the four corner portions 16, which are the rattling prevention structures 9 on the cover 6 side, are formed on an inner surface of the opening portion 14. The opening portion 14 is referred to as an "opening portion" including not only an opening edge but also a part of a range in which the connector block 7 is inserted.

<Four Walls 15>

In FIGS. 3 and 4, "four" of the four walls 15 is a total of four: two of a first wall 19 and a second wall 20 which are at a predetermined interval in the front-rear direction indicated by the arrow R, and two of a third wall 21 and a fourth wall 22 which are at a predetermined interval in the left-right direction indicated by the arrow Q. As can be seen from the drawings, the first wall 19 and the second wall 20 are formed to be larger than the third wall 21 and the fourth wall 22. The first wall 19 and the second wall 20 are formed in accordance with a size of the substrate 5 in the plan view. On the other hand, the third wall 21 and the fourth wall 22 are formed in elongated rectangular walls. The third wall 21 and the fourth wall 22 are formed in accordance with a size of the substrate 5 in a front-back direction. The four walls 15 are formed such that the four corner parts 16 (described later) are interposed between the walls on the opening portion 14 side. The walls are formed to be continuous on a side which is not the opening portion 14 side.

<Bracket Attachment and Detachment Portion 23>

In FIGS. 1 to 3, the first wall 19 of the four walls 15 is integrally formed with a bracket attachment and detachment portion 23 which is detachably attached to the bracket 4 provided in an automobile. The disposing and the shape of the bracket attachment and detachment portion 23 illustrated in the drawings is an example.

<Four Corner Parts 16 (Rattling Prevention Structure 9)>

In FIGS. 2 to 4, the four corner parts 16 are the rattling prevention structure 9 on the cover 6 side as described above. The four corner parts 16 correspond to continuous parts of the four walls 15 at the opening portion 14. Specifically, the four corner parts 16 correspond to a first corner part 24 between the first wall 19 and the third wall 21, a second corner part 25 between the second wall 20 and the third wall 21, a third corner part 26 between the second wall 20 and the fourth wall 22, and a fourth corner part 27 between the fourth wall 22 and the first wall 19. The four corner parts 16 are formed in tapered parts facing four corner portions 33, which will be described later, of the connector block 7. As can be seen from the drawings, the four corner parts 16 are formed to be inclined at 45 degrees. The four corner parts 16 are formed to be sufficiently short in length as compared with the four walls 15. Inner surfaces of the four corner parts 16 are formed in flat surfaces without unevenness. The inner surface is formed in a surface on which a pressing protrusion 43, which will be described later, of the four corner portions 33 is in sliding contact, and is formed in a surface which is configured to receive operation from a pressing protrusion 43.

<Cover Side Lock Portion 18 (Engagement Mechanism 8)>

In FIG. 4, the cover side lock portion 18 is an engagement mechanism 8 formed on the cover 6 side as described above. In the opening portion 14, one cover side lock portion 18 is formed on the first wall 19 and two cover side lock portions 18 are formed on the second wall 20 (the disposing and the number of the cover side lock portions 18 are one example). The cover side lock portion 18 is formed in a substantially claw-shaped protrusion protruding inward from inner surfaces of the first wall 19 and the second wall 20. The cover side lock portion 18 is formed with a tapered or curved guide surface (reference numeral omitted) and a locking surface (reference numeral omitted) which is hooked by a block side lock portion 38 described later.

<Connector Block 7 (Block Member)>

In FIGS. 2, 3, 5, 6, and 7, the connector block 7 is assembled to a substrate front portion 12 of the substrate 5 and is formed so as to perform connector connection in the electronic component module 1. The connector block 7 includes a block body 28 which is a resin molded product. The connector block 7 is formed to function as a connector by the distal end side of the pin terminal 11 of the substrate 5 passing through the block body 28. The connector block 7 includes the block body 28 and (the distal end side) of the pin terminal 11.

<Block Body 28>

In FIGS. 3, 5, 6, and 7, three types of connector connection portions 29 to 31 are formed in the block body 28. The connector connection portions 29 to 31 are configured to enable connector connection to a connector (not illustrated) of the wire harness 2 (see FIG. 1) and is formed in a cavity shape. The distal end side of the pin terminal 11 protrudes into each of the connector connection portions 29 to 31.

A side portion of the block body 28 is formed in an illustrated shape including four side portions 32 and four corner portions 33. The side portion of the block body 28 is formed in accordance with a shape of the opening portion 14 of the cover 6. The block body 28 is formed in a block-shaped member which is less likely to be bent than the cover 6.

<Four Side Portions 32>

Figure 5A:
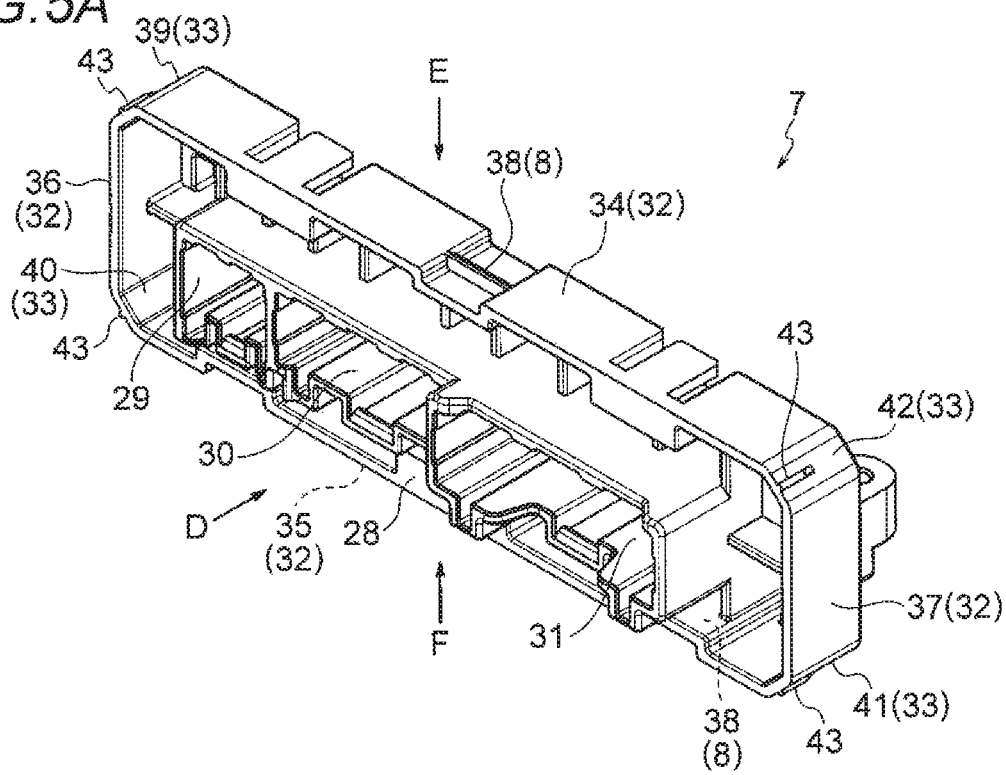
FIGS. 5A and 5B illustrate a connector block.
Figure 5B:
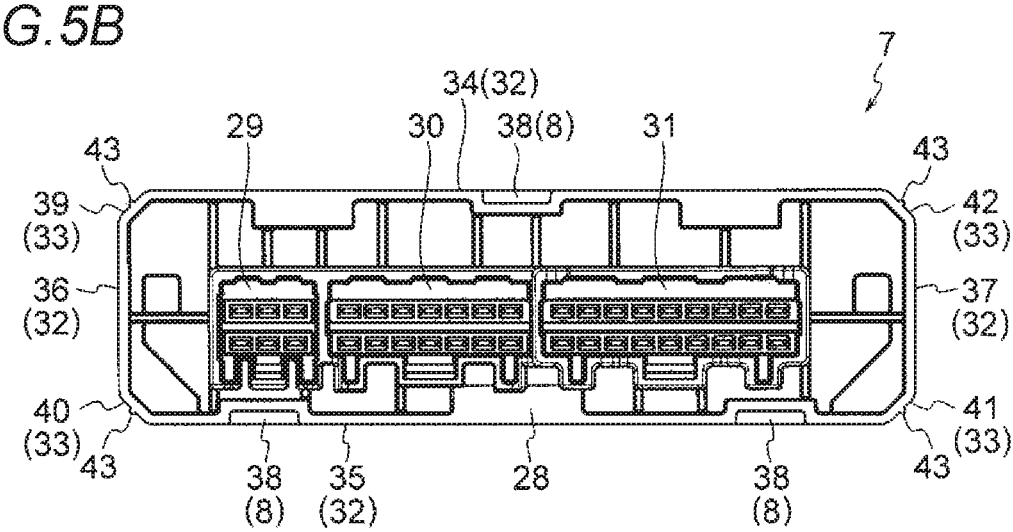
Figure 6:
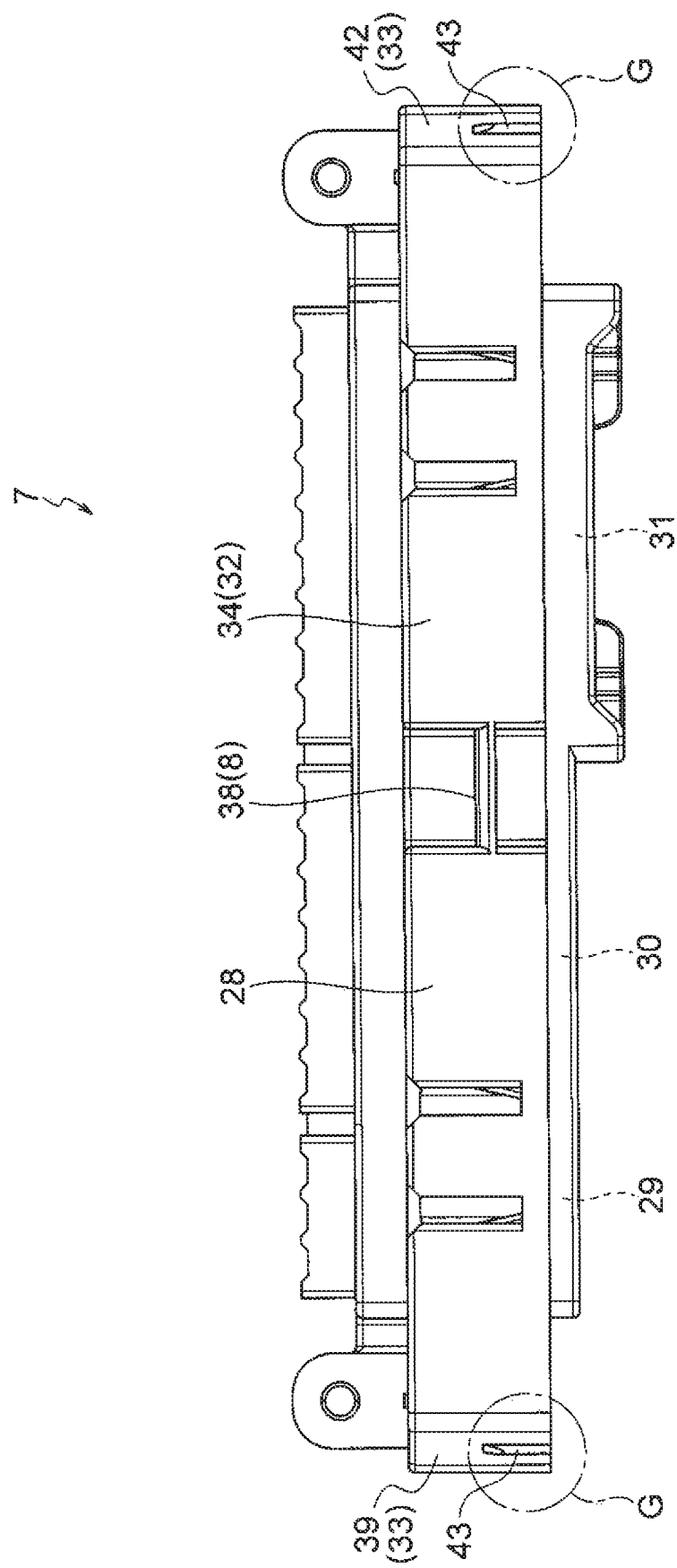
FIG. 6 is a view of the connector block as viewed from an arrow E direction in FIG. 5A.
Figure 7:
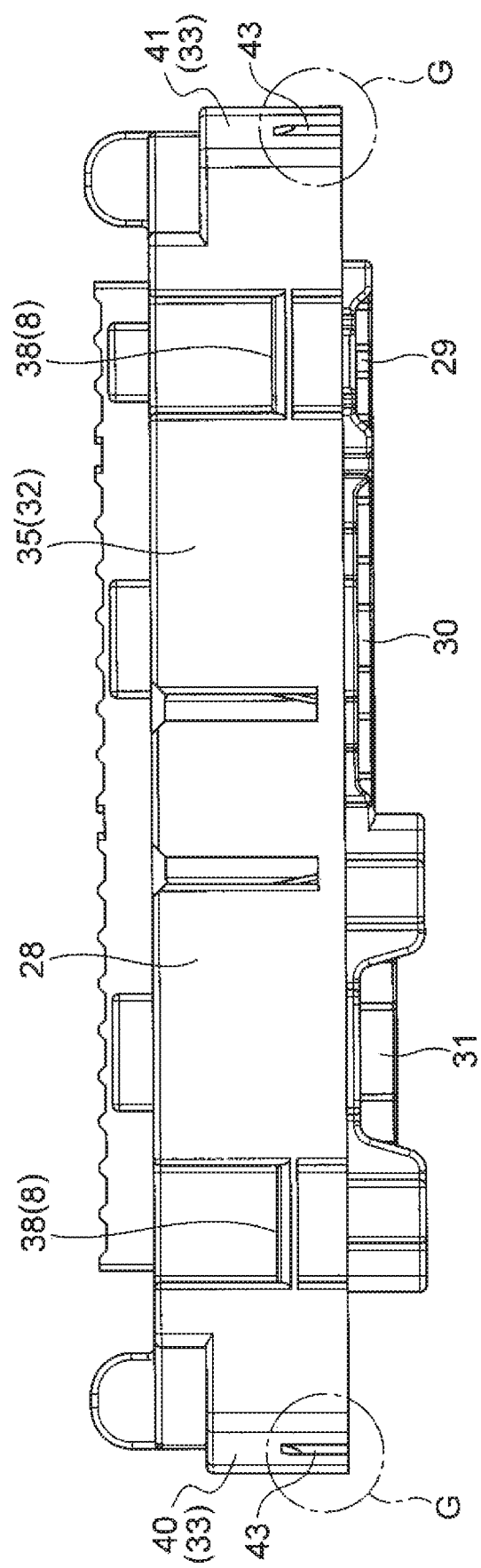
FIG. 7 is a view of the connector block as viewed from an arrow F direction in FIG. 5A.
Figure 8A:
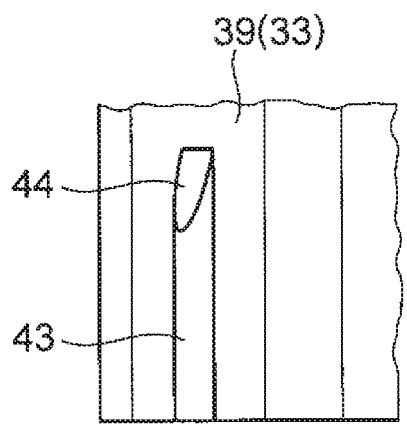
FIGS. 8A to 8D are enlarged views of four main parts of the connector block which are indicated by circles G in FIGS. 6 and 7.
Figure 8B:
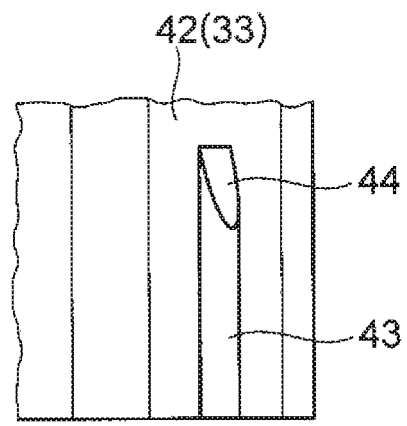
Figure 8C:
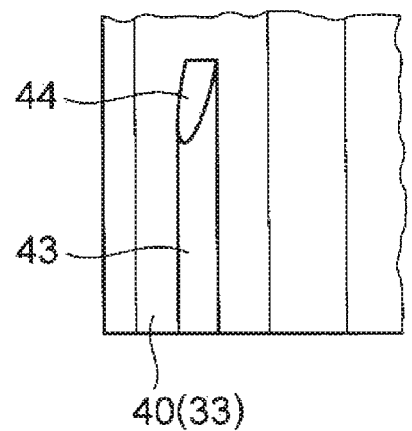
Figure 8D:
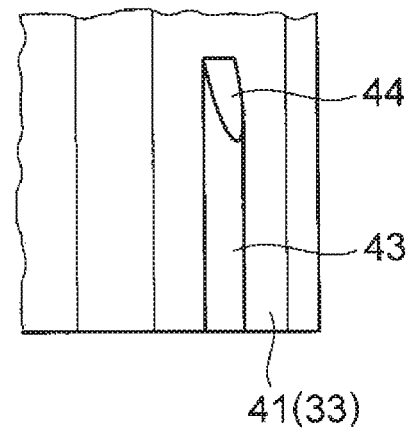

In FIGS. 5 to 7, the four side portions 32 includes a first side portion 34 and a second side portion 35 which face the first wall 19 and the second wall 20 in the opening 14 of the cover 6, and a third side portion 36 and a fourth side portion 37 which face the third wall 21 and the fourth wall 22 in the opening 14. A plurality of block side lock portions 38, which are engagement mechanisms 8 on a connector block 7 side, are formed on the first side portion 34 and the second side portion 35.

<Block Side Lock Portion 38 (Engagement Mechanism 8)>

In FIGS. 5 to 7, the block side lock portion 38 is the engagement mechanism 8 formed on the connector block 7 side as described above. The block side lock portion 38 is engaged with the cover side lock portion 18 in the opening portion 14 of the cover 6 and is disposed and formed in accordance with a position of the cover side lock portion 18. The block side lock portion 38 is formed in a substantially claw-shaped protrusion protruding outward from a bottom of a part where outer surfaces of the first side portion 34 and the second side portion 35 are lowered. The block side lock portion 38 is formed with a tapered or curved guide surface (reference numeral omitted) and a locking surface (reference numeral omitted) which is hooked by the cover side lock portion 18.

<Four Corner Portions 33 (Rattling Prevention Structure 9)>

In FIGS. 5 to 8, the four corner portions 33 are one of the rattling prevention structures 9 on the connector block 7 side. The four corner portions 33 include a first corner portion 39 facing the first corner part 24 of the four corner parts 16 in the opening portion 14 of the cover 6, a second corner portion 40 facing the second corner part 25, a third corner portion 41 facing the third corner part 26, and a fourth corner part 42 facing the fourth corner part 27. The four corner portions 33 are formed in a tapered portion inclined at 45 degrees. The four corner portions 33 are formed to have sizes such that minute gaps are formed between outer surfaces of the four corner portions 33 and inner surfaces of the four corner parts 16. The four corner portions 33 (the first corner portion 39 to the fourth corner portion 42) are formed with pressing protrusions 43 which are one of the features of the present invention.

<Pressing Convex Portion 43 (Rattling Prevention Structure 9)>

In FIGS. 5 to 8, the pressing protrusion 43 is a rib-shaped portion protruding outward from the outer surfaces of the four corner portions 33 (the first corner portion 39 to the fourth corner portion 42), and is formed so as to extend straight in the upper-lower direction (see FIGS. 2 and 3) indicated by the arrow P (in the present embodiment, extend about half of a length of each of the four corner portions 33). The pressing protrusion 43 is formed to protrude slightly higher than a dimension corresponding to the minute gap. As can be seen from the drawings, the pressing protrusion 43 is a rib-shaped protrusion having a minute height. The pressing protrusion 43 is formed in a solid portion in which crushing does not occur (which is different from a general press-in protrusion that stops rattling by crushing). The pressing protrusion 43 is formed in the solid portion which can press the four corner parts 16 of the cover 6 outward. The pressing protrusions 43 may be formed on the four corner parts 16 instead of on the four corner portions 33. The pressing protrusion 43 may be formed at any one of the four corner portions 33 and the four corner parts 16 as long as the pressing protrusion 43 is a source of a force that causes the four corner parts 16 to be displaced (see arrows in FIG. 11) outward. A reference numeral 44 in the pressing protrusion 43 indicates an inclined surface for guiding with respect to the cover 6.

<Rattling Prevention Structure 9>

In FIGS. 9 and 10, as described above, the rattling prevention structure 9 includes the four corner parts 16 (the first wall 19 to the fourth wall 22) of the cover 6, the four corner portions 33 (the first corner portion 39 to the fourth corner portion 42) of the connector block 7, and the four pressing protrusions 43 formed on the four corner portions 33. When the connector block 7 is inserted into and engaged with the opening portion 14 of the cover 6, the four corner parts 16 are pressed outward by the four pressing protrusions 43, and the four walls 15 (the first wall 19 to the fourth wall 22) of the cover 6 are bent inward by operation at this time as illustrated in FIG. 11. In other words, the four walls 15 (the first wall 19 to the fourth wall 22) are pressed against the four side portions 32 (the first side portion 34 to the fourth side portion 37) of the connector block 7. In this state, a state of the engagement mechanism 8 (see FIG. 9), that is, a state of engagement between the cover side lock portion 18 and the block side lock portion 38 is maintained stable without disengagement.

<Effects of Rattling Prevention Structure 9>

As described above with reference to FIGS. 1 to 11, first, according to the rattling prevention structure 9, when the connector block 7 is inserted into the opening portion 14 of the cover 6, the four walls 15 of the cover 6 are bent inward by the operation of the four pressing protrusions 43, so that bent parts press the four side portions 32 of the connector block 7. Therefore, even when vibration occurs, rattling does not occur in an X direction and a Y direction (a longitudinal direction and a lateral direction) in FIG. 11. Further, when the bent parts press the connector block 7, the cover 6 and the connector block 7 are not likely to be disengaged from each other. Therefore, according to the rattling prevention structure 9, rattling can be prevented even when vibration occurs, and thus the engagement state by the engagement mechanism 8 can be maintained stable. If the engagement state can be maintained stable, reliability can also be enhanced.

<Effects of Electronic Component Module 1 and Wire Harness 2>

Next, according to the electronic component module 1, the rattling prevention structure 9 is used. Therefore, rattling does not occur between the cover 6 and the connector block 7, and as a result, a better electronic component module 1 can be provided. Further, according to the wire harness 2, the electronic component module 1 having the effects described above is provided. Naturally, a better wire harness 2 can be provided.

In addition, it goes without saying that the present invention can be variously modified without departing from the gist of the present invention.

What is claimed is:

1. A rattling prevention structure comprising:
   a cover which has a bottomed cylindrical shape and includes a substantially rectangular opening portion;
   a block member which is inserted into the opening portion of the cover; and
   an engagement mechanism which is configured to engage the block member with the opening portion of the cover,
   wherein four pressing protrusions are formed at any one of four corner parts of the cover and four corner portions of the block member at the opening portion so as to bend four walls of the cover inward while displacing the four corner parts outward, and
   wherein bent parts of the four walls press four side portions of the block member.

2. The rattling prevention structure according to claim 1, wherein
   the four corner parts and the four corner portions are formed in tapered shapes facing each other.

3. An electronic component module comprising:
   a substrate on which a plurality of electronic components are mounted;
   a cover which has a bottomed cylindrical shape and includes a substantially rectangular opening portion,
   a block member which is inserted into the opening portion of the cover in a state that the substrate is held; and
   an engagement mechanism which is configured to engage the block member with the opening portion of the cover,
   wherein the rattling prevention structure according to claim 1 is used to prevent rattling between the cover and the block member.

4. An electrical connection box comprising:
   the electronic component module according to claim 3;
   a frame to which the electronic component module is assembled; and
   a lid member which is configured to cover a frame opening portion of the frame.

5. A wire harness including the electrical connection box according to claim 4 at an end of the wire harness and wired in a vehicle.

6. A wire harness including the electronic component module according to claim 3 at an end of the wire harness and wired in a vehicle.

7. The wire harness according to claim 6, wherein
   the cover of the electronic component module is formed with a bracket attachment and detachment portion which is attachable to and detachable from a bracket provided in the vehicle.

8. The rattling prevention structure according to claim 1, wherein
   the bent parts of the four walls press the four side portions of the block member inward.

9. The rattling prevention structure according to claim 8, wherein
   the bent parts of the four walls press the four side portions of the block member inward such that the cover and the block member are engaged in a longitudinal direction and a lateral direction.

10. The rattling prevention structure according to claim 1, wherein
    the bent parts of the four walls press the block member such that the cover and the block member are engaged in a longitudinal direction and a lateral direction.

* * * * *